US011985793B2

(12) United States Patent
Doglio et al.

(10) Patent No.: US 11,985,793 B2
(45) Date of Patent: May 14, 2024

(54) CABLE SEALING APPARATUS AND METHODS

(71) Applicant: DELL PRODUCTS L.P., Round Rock, TX (US)

(72) Inventors: Jean M. Doglio, Round Rock, TX (US); Patrick V. Illingworth, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 498 days.

(21) Appl. No.: 17/156,075

(22) Filed: Jan. 22, 2021

(65) Prior Publication Data

US 2022/0240409 A1  Jul. 28, 2022

(51) Int. Cl.
*H05K 7/20* (2006.01)
*H05K 7/14* (2006.01)

(52) U.S. Cl.
CPC ........... *H05K 7/202* (2013.01); *H05K 7/1491* (2013.01)

(58) Field of Classification Search
CPC ........ H05K 7/1491; H05K 7/202; H02G 3/22; H02G 3/30; H02G 3/088; H02G 3/083; H02G 7/05; H02G 3/32
USPC ......................................................... 248/65
See application file for complete search history.

(56) References Cited

U.S. PATENT DOCUMENTS

| | | | | |
|---|---|---|---|---|
| 2,396,836 A | * | 3/1946 | Ellinwood ............ | F16L 55/035 174/157 |
| 3,229,026 A | * | 1/1966 | Sulzer ................. | H02G 3/0616 174/664 |
| 3,830,954 A | * | 8/1974 | Caudill ................ | H05K 9/0018 174/362 |
| 4,249,353 A | * | 2/1981 | Berry ........................ | F16L 5/04 428/921 |
| 4,267,994 A | * | 5/1981 | Lynch ................... | F16L 55/035 248/65 |

(Continued)

FOREIGN PATENT DOCUMENTS

| | | | | |
|---|---|---|---|---|
| CN | 102686077 A | * | 9/2012 | ............. G06F 1/183 |
| CN | 109104837 A | * | 12/2018 | ........... H05K 7/1491 |

(Continued)

OTHER PUBLICATIONS

Ziegler et al., "Systems and Methods for In-Silicon Measurement of Printed Circuit Board (PCB) Trace Impedance", U.S. Appl. No. 16/988,021, filed Aug. 7, 2020, DELL:294, 46 pgs.

(Continued)

*Primary Examiner* — Taylor Morris
(74) *Attorney, Agent, or Firm* — Egan, Enders & Huston LLP.

(57) ABSTRACT

Cable channel apparatus are provided that may be employed for routing system cables through open spaces defined within chassis walls, barriers or other fixed surfaces that separate different compartments or areas of an information handling system chassis. The cable channel apparatus may form a seal around the inserted system cables that prevents recirculation of cooling air through the open spaces between the different compartments. In one example, the cable channel apparatus may be employed to form such a seal around system cables that are routed through an open space to pass though or around a fan gantry that is mounted within a chassis of an information handling system chassis.

25 Claims, 16 Drawing Sheets

(56) References Cited

U.S. PATENT DOCUMENTS

| | | | | |
|---|---|---|---|---|
| 4,775,121 | A * | 10/1988 | Carty | F16L 3/2235 403/381 |
| 4,884,774 | A * | 12/1989 | Rodi | H02G 3/22 248/68.1 |
| 5,241,136 | A * | 8/1993 | Michaelis | H02G 3/0658 174/653 |
| 5,834,693 | A * | 11/1998 | Waddell | H02G 3/22 439/94 |
| 6,135,398 | A * | 10/2000 | Quesnel | G02B 6/4471 248/74.1 |
| 6,561,466 | B1 * | 5/2003 | Myers | F16L 3/221 248/68.1 |
| 6,601,802 | B1 * | 8/2003 | Howe | F16L 55/035 248/58 |
| 6,658,193 | B1 * | 12/2003 | Ati | G02B 6/4471 385/136 |
| 6,902,138 | B2 * | 6/2005 | Vantouroux | F16L 3/1091 248/68.1 |
| 6,934,148 | B2 * | 8/2005 | Gorenz, Jr. | H05K 7/20727 361/688 |
| 7,445,521 | B2 * | 11/2008 | Dixon | F16L 3/2235 439/465 |
| 7,650,911 | B2 * | 1/2010 | Follett | F16L 55/02 138/108 |
| 7,770,848 | B2 * | 8/2010 | Johnson | F16L 3/1207 248/65 |
| 8,033,408 | B2 * | 10/2011 | Makela | H02G 3/088 174/152 G |
| 8,051,614 | B1 * | 11/2011 | Peck | H02G 3/22 52/220.8 |
| 8,056,868 | B2 * | 11/2011 | Vander Griend | F16L 3/1075 248/68.1 |
| 8,074,945 | B2 * | 12/2011 | Schoenau | F16L 5/14 248/65 |
| 8,157,222 | B1 * | 4/2012 | Shirey | H02G 3/32 248/68.1 |
| 8,173,902 | B2 * | 5/2012 | Smallhorn | H02G 3/32 248/65 |
| 8,598,462 | B2 * | 12/2013 | Li | H05K 7/1491 248/68.1 |
| 8,616,506 | B2 * | 12/2013 | Milton | H02B 1/305 248/65 |
| 9,022,814 | B2 * | 5/2015 | Fabrykowski | G02B 6/4471 361/826 |
| 9,212,765 | B1 * | 12/2015 | Chia | F16L 3/127 |
| 9,304,060 | B2 * | 4/2016 | Husted | G01M 15/10 |
| 9,360,648 | B2 * | 6/2016 | Rudenick | G02B 6/46 |
| 9,528,636 | B2 * | 12/2016 | Beele | F16L 5/10 |
| 9,556,974 | B2 * | 1/2017 | Even | F03D 80/80 |
| 9,722,404 | B2 * | 8/2017 | Beele | F16L 3/227 |
| 10,114,188 | B2 * | 10/2018 | Miller | G02B 6/4477 |
| 10,231,034 | B1 * | 3/2019 | Wu | G06F 1/182 |
| 10,232,804 | B2 * | 3/2019 | Drezet | B32B 5/18 |
| 10,283,950 | B2 * | 5/2019 | Gintz | H02G 3/32 |
| 10,622,795 | B2 * | 4/2020 | Karlsson | A62C 3/16 |
| 10,797,477 | B1 * | 10/2020 | Peterson | H02G 3/32 |
| 10,973,147 | B1 * | 4/2021 | Tsorng | H05K 7/20754 |
| 11,217,979 | B2 * | 1/2022 | Claessens | H02G 3/22 |
| 11,324,138 | B2 * | 5/2022 | Hung | H05K 7/20145 |
| 2009/0189026 | A1 * | 7/2009 | Bourgeois | H02G 3/0456 248/70 |
| 2011/0249395 | A1 * | 10/2011 | Doglio | G06F 1/186 361/801 |
| 2013/0271934 | A1 * | 10/2013 | He | H05K 7/1491 361/752 |
| 2015/0077935 | A1 * | 3/2015 | Wright | H05K 7/1491 248/65 |
| 2016/0044813 | A1 * | 2/2016 | Schörner | H05K 5/04 174/50.56 |
| 2018/0080579 | A1 * | 3/2018 | Costigan | H04Q 1/06 |
| 2018/0343765 | A1 * | 11/2018 | Lin | H05K 7/20727 |
| 2019/0154008 | A1 * | 5/2019 | Yagci | F16L 3/1058 |
| 2019/0200487 | A1 * | 6/2019 | Coteus | H05K 7/1489 |
| 2020/0315049 | A1 * | 10/2020 | Hsieh | H05K 7/20145 |
| 2021/0378130 | A1 * | 12/2021 | Chang | H05K 5/03 |

FOREIGN PATENT DOCUMENTS

| | | | | |
|---|---|---|---|---|
| KR | 20170124740 A | * | 11/2017 | H05K 7/1489 |
| TW | I719849 B | * | 2/2021 | H05K 7/1447 |
| WO | WO-2020179177 A1 | * | 9/2020 | B60R 16/0215 |
| WO | WO-2022111805 A1 | * | 6/2022 | H05K 7/1489 |

OTHER PUBLICATIONS

Wikipedia, "Compression Set", Printed from Internet Dec. 15, 2020, 2 pgs.
Rathbun, "Confor Foams", Printed from Internet Dec. 14, 2020, 5 pgs.
Wikipedia, "Living Hinge", Printed from Internet Dec. 14, 2020, 2 pgs.
Wikipedia, "Memory Foam", Printed from Internet Dec. 15, 2020, 6 pgs.
Hung et al., "Systems and Methods for Minimizing Airflow Bypass and Recirculation Through a Cable Channel", U.S. Appl. No. 16/914,642, filed Jun. 29, 2020, 30 pgs.
Aearo Technologies, EAR, Confor EG Foams, Material Summary Sheet 50, 2017, 4 pgs.

* cited by examiner

CABLE SEALING APPARATUS AND METHODS

FIELD

This invention relates generally to information handling systems, and more particularly, to cable sealing apparatus and methods for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As server system workloads grow, eliminating airflow recirculation in server system chassis enclosures becomes more important in order to properly cool server systems. FIGS. 1 and 2 are simplified end view illustrations of a front end of a metal 2U rackmount chassis enclosure 104 of a conventional server system 100 with its top cover removed. Cable channel 104 includes a plastic cable door 115 that is hingeably mounted to the body 117 of the cable channel 104 by an integral plastic living hinge 119. As shown in FIG. 1, the body 117 of a conventional plastic hinged cable channel 104 is assembled and fixed to an inner surface 109 of a side wall of the chassis enclosure 102 adjacent the front end of the chassis enclosure 104 by slotted hooks and snaps. This assembly must be done with no fan gantry installed due to needed clearance for fastening the cable channel 104 to the inner surface 109 of chassis enclosure 102, and to provide sufficient clearance to open cable door 115 to receive cables 112 as described further.

FIG. 3 illustrates a conventional methodology 300 for positioning and securing cables 112 of different sizes and shapes (shown in end cross-sectional view) within the cable channel 104. Methodology 300 begins in step 302 where the cables 112 are first plugged into a backplane positioned outside and attached to the front end of the chassis enclosure 102. In step 304, the plastic cable door 115 is swung open from the body 117 of the cable channel 104 as shown by the sideward arrow in FIG. 1. Next, in step 306, cables 112 of different sizes and shapes (shown in cross-sectional end view in FIG. 1) are placed downward into a trough 121 of the cable channel as shown by the downward arrow in FIG. 3.

Next, in step 308 the cable door 115 is swung closed (as shown by the arrow in FIG. 2) to engage mating features 110 of the cable door 115 with mating features 106 defined within the cable channel body 117 so as to hold the cable door 115 in closed position to trap the cables 112 between the closed plastic cable door 115 and foam block 120. The mating features 110 and 106 of the cable door 115 and cable channel body 117 take up about 5 millimeters of vertical space above the cable retention area between closed plastic cable door 115 and foam block 120, thus reducing the available space for insertion and routing of cables 112 through conventional cable channel 104 installed on a 2U chassis enclosure 104 such as shown in FIGS. 1 and 2.

As shown in FIG. 2, the plastic of the cable door 115 is thin and flexible, and tends to bow outwards when closed around cables 112. The cables are next adjusted in step 310 as needed within the closed cable channel 104. Then, in step 312 free ends of cables 112 are routed inside the chassis enclosure 102 and plugged into the motherboard. At this time, a fan gantry 130 may be installed and attached by fasteners to the front end of chassis enclosure 102 adjacent the closed cable channel 104 as shown in dashed outline in FIG. 2. Fan gantry 135 includes multiple fans 135 that operate to draw ambient air into the front end of the chassis enclosure for cooling heat-producing components inside the chassis enclosure 104.

As shown in FIG. 2, a complete seal against airflow recirculation is not formed by cable channel 104 when it is closed around cables 112. Rather, foam 120 only contact portions of cables 112 on one side of the cables 112, leaving air gaps 210 through which cooling air may escape from inside chassis enclosure 102. Other air gaps 220 also exist between fan gantry 130 and closed cable channel 104 as shown in FIG. 2. Gaps 210 and 220 provide airflow paths for loss or recirculation of cooling air from inside of chassis enclosure 104 to the ambient environment outside chassis enclosure 104. Moreover, foam 120 of cable channel 104 permanently compresses and conforms to the outer shape of cables 112, which can result in formation of additional gaps between the outside of cables 112 and the compressed foam 120. During system operation, this loss of cooling air through gaps 210 and 220 reduces the effectiveness of the cooling air provided by cooling fans 135 of fan gantry 130, which may lead to overheating of heat-producing components inside chassis enclosure 140 and/or unnecessary energy expense to operate cooling fans 135 at higher fan rotation speeds. As also shown in FIG. 2, fan gantry 130 contacts the bowed cable door 115, which can interfere with installation of fan gantry 130.

Another conventional solution utilizes flexible molded rubber fingers that attach to and extend into a cable trough provided adjacent the front of a chassis enclosure for receiving cables through hinged plastic door provided at the top of the cable trough. The conventional cable trough is positioned at one side of the chassis enclosure between an inner surface of the chassis enclosure side wall and the end of a fan gantry. The rubber fingers flex to allow room for adjustment of cables that are inserted from above through the open door and into the cable trough. However, the rubber fingers do not form a seal against cooling airflow recirculation out of the chassis enclosure since a large amount of open area exists around and between the rubber fingers. This open area allows flow of recirculated cooling air through the trough from inside of the chassis enclosure to the ambient environment outside the chassis enclosure.

Elongated foam strips have been employed between flat and planar sheet metal surfaces of a server chassis, such as between the underside surface of a chassis top cover and the upper surface of a fan gantry or between the lower surface of a fan gantry and the upper side of a chassis bottom wall.

SUMMARY

Disclosed herein are cable channel apparatus that may be employed for routing system cables through open spaces defined within chassis walls, barriers or other fixed surfaces that separate different compartments or areas of an information handling system chassis. In one embodiment, the disclosed cable channel apparatus may form a seal around the inserted system cables that prevents recirculation of cooling air through the open spaces between the different compartments. In another embodiment, the cable channel apparatus may be employed to form such a seal around system cables that are routed through an open space to pass though or around a fan gantry that is mounted within a chassis of an information handling system chassis. Besides cables, the disclosed cable channel apparatus may also or alternatively be employed to form such a seal around other objects besides cables (e.g., such as thermometer probe, remote camera lens, etc.) that that transverse an enclosed section of an information handling system chassis.

In one embodiment, cables may be inserted and sealed against airflow recirculation within the disclosed cable channel apparatus in a position adjacent a non-removable fan gantry that is integrally formed as part of a 1U chassis structure or otherwise when one or more installed cooling fans are present. In another embodiment, the disclosed cable channel apparatus may be positioned to route and seal system cables against airflow recirculation in a position within a designated side open space positioned on one side of a fan gantry within a chassis, or within a designated intermediate open space (e.g., center open space) between fan gantry sections within a chassis. In one embodiment, the disclosed cable channel apparatus may be configured to slide into a confined fixed open space or open space between two fixed (e.g., temporarily or permanently fixed) walls or other spaced-apart vertical surfaces of the chassis (e.g., between a fan gantry end wall and an adjacent chassis side wall, between two non-fan gantry surfaces such as between a chassis end wall and a chassis intermediate walls, etc.), and without requiring snap or other fasteners or features to retain the cable channel to the chassis. In another embodiment, the disclosed cable channel apparatus may be configured so that it may be installed into, and removed from, a designated open space while adjacent cooling fans or a cooling fan gantry is present in the chassis (or are a permanent non-removable part of the chassis).

Benefits that may be realized in various different embodiments disclosed herein include, but are not limited to, providing a better and more consistent seal against airflow around system cables than is possible with conventional solutions, providing greater ease to properly route system cables from the interior of an information handling system chassis to the chassis exterior while at the same time providing a cable sealing performance that is less sensitive to inconsistent cable placement within the cable channel, providing consistent cable-sealing performance (even after system cables are removed and installed in a different order or different cables are installed) by using compressible foam or other compressible media that returns to its original shape when contact with system cables is removed, may be engineered and dimensioned to be backwards compatible with previous or pre-existing fan gantry and chassis configurations or may employ simplified geometry and fewer parts where backwards chassis compatibility is not required, may be utilized with minimal rubbing of cables against foam since the cable channel may be configured to closes around the foam and inserted cables (i.e., cables do not need to be slid lengthwise through the disclosed cable channel), provision of the same consistent quality seal around system cables regardless of how many system cables are populated and routed through the disclosed cable channel apparatus, provision of a seal through the disclosed cable channel apparatus when no cables are routed through the channel, provision of a cable channel apparatus that is dimensioned to provide a seal against air recirculation that has a length that extends the entire depth of an adjacent fan gantry or cooling fan to provide greater impedance against airflow recirculation through the seal.

In one respect, disclosed herein is an apparatus, including: a shell including a clamp coupled by a hinge to a body of the apparatus, the clamp and body having an open position when apart from each other and a closed position when joined together into contact with each other; and a compressible material disposed on at least one of an inner surface of the clamp or an inner surface of the body. In its closed position the apparatus is slidably receivable into a space defined between two fixed and spaced-apart surfaces of a chassis of an information handling system and forming a seal against airflow when received within the space defined between the two spaced-apart surfaces.

In another respect, disclosed herein is an information handling system, including: a chassis having a space defined between two fixed spaced-apart surfaces; and an apparatus slidably received within the space defined between the two fixed spaced-apart surfaces to form a seal against airflow. The apparatus may include: a shell including a clamp coupled by a hinge to a body of the apparatus, the clamp and body being joined together into contact with each other in a closed position, and a compressible material disposed on at least one of an inner surface of the clamp or an inner surface of the body.

In another respect, disclosed herein is a method, including: moving an apparatus from an open position to a closed position, the apparatus including a shell having a clamp and body that are separate and apart from each other in the open position and that are joined together into contact with each other in the closed position; and installing the closed apparatus into a space defined between two fixed spaced-apart surfaces within a chassis of an information handling system by sliding the closed apparatus into the space to form a seal against airflow. In the method, the apparatus may further include a compressible material disposed on at least one of an inner surface of the clamp or an inner surface of the body.

DESCRIPTION OF ILLUSTRATIVE EMBODIMENTS

Figure 4:
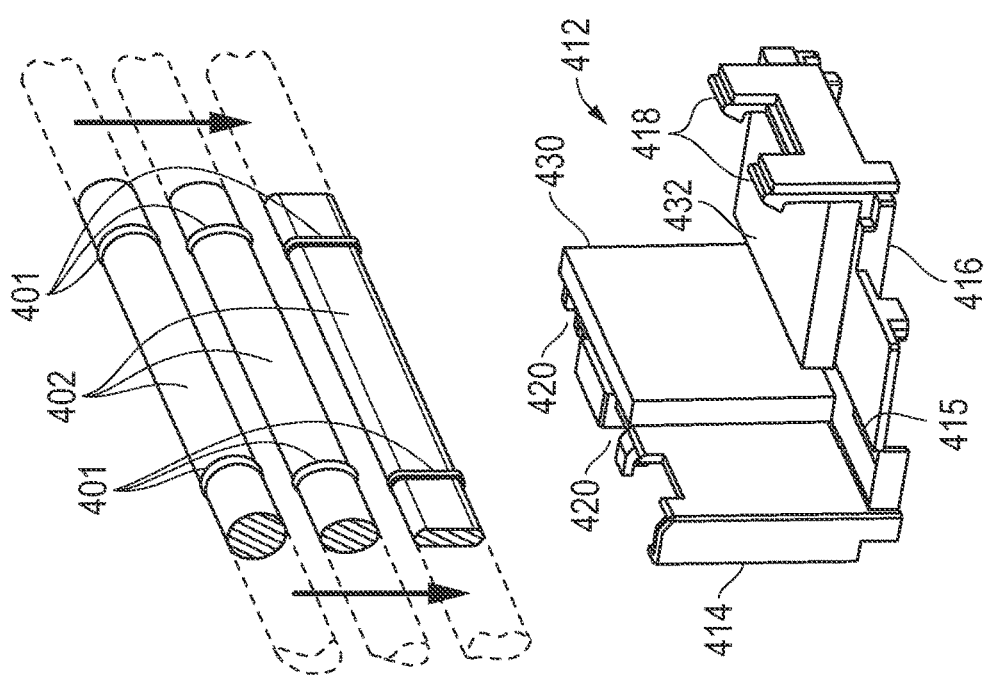
FIG. 4 illustrates a front perspective view of a cable channel according to one exemplary embodiment of the disclosed apparatus and methods.

FIG. 4 illustrates a front perspective view of one embodiment of an opened cable channel 412 that is configured for installation within a mating open space defined within chassis walls, barriers or other fixed surfaces that separate different compartments or areas of an information handling system chassis. In FIG. 4, opened cable channel 412 is shown positioned separate from an information handling system chassis 700, and is positioned to receive multiple cables 402 (e.g., power cables, signal cables, data cables, etc.) having different exemplary cross-sectional shapes, e.g., circular shape, oval shape and elongate bar shape, it being understood that other shapes and/or numbers of cables may be similarly positioned for insertion into open cable channel 412. For purposes of illustration, FIG. 4 only shows a partial section of each cable 402 that represents a short length of the cable that is to be positioned and inserted within cable channel 412, i.e., each cable 402 is longer than illustrated.

In the embodiment of FIG. 4, cable channel 412 is configured as a shell including a clamp 416 that is attached by a hinge 415 to a body 414 of the cable channel 412. In one embodiment, the shell of the entire cable channel 412 may be made of one piece of injection molded plastic such as polyethylene, polypropylene, etc. with hinge 415 formed as a living hinge. However, the shell of cable channel 412 may be constructed of any other suitable plastic or may be constructed of alternative materials, e.g., such as two pieces of stamped sheet metal joined together at hinge 415. In one embodiment, the shell of cable channel 412 (including each of hinged clamp 416 and body 414) may be configured to be sufficiently rigid against flexing or bowing so as to prevent deformation and outward bowing of the shell when clamp 416 and body 414 are closed together around one or more cables 402 in a manner as described further herein. In this regard, rigidity of hinged clamp 416 and body 414 may be controlled by selection of material and/or component configuration (e.g., by increased component thickness and/or inclusion of reinforcing structures).

Being sufficiently rigid to prevent outward bowing allows cable channel 412 to be dimensioned to conform and contact the sides of an open space defined within chassis walls or barriers that separate different compartments or areas of an information handling system chassis (e.g., such as open space 790 of FIG. 7A or open space 890 of FIG. 8B), and to take up the entire height and width of the open space to form an airflow seal with the sides of the open space. At the same time, this rigidity allows cable channel 412 to be inserted into place (with inserted cables 402) within the open space without encountering excessive resistance that prevents such insertion.

Still referring to FIG. 4, cable channel 412 includes a first block 430 of compressible material that is attached (e.g., adhered by an adhesive such as epoxy) to the inner surface (e.g., at least partially received within a complementary-shaped recess that may be rectangular in one embodiment) of cable channel body 414 as shown. Cable channel 412 also includes a second block 432 of compressible material attached (e.g., adhered by an adhesive such as epoxy) to the inner surface (e.g., at least partially received within a complementary-shaped recess that may be rectangular in one embodiment) of cable channel clamp 416 as shown. In one embodiment, each of first block 430 and second block 432 of compressible material may extend the depth (or substantially the depth) of the cable channel 412. In one embodiment, each of blocks 430 and 432 may be composed of a foam, e.g., a memory foam (such as polyurethane foam such as E-A-R™ Confor™ available from 3M Company of Saint Paul, Minnesota) which has low resistance to compression (e.g., requiring a minimal amount of force to deflect), a low compression (e.g., in relation to the material returning to its original shape), and in one embodiment fully returns back its original shape when loading is removed.

Below are some exemplary compression properties (values) for example embodiments of compressible material that may be used for first block 430. It will be understood that these below values are exemplary only, and that compressible material having values of compression set, indentation force deflection, and/or compression load deflection that are greater or lesser that the exemplary values (and value ranges) given below are also possible.

Compression Set (%)=less than 1% (as measured per ASTM D3574, 22 hours at 22° C., Compressed 50%)

Indentation Force Deflection=10-28 lbf in one embodiment, 10-17 lbf in another embodiment, and 15-28 lbf in a further embodiment (as measured per ASTM D3574 Test B1 Modified 25% Deflection for 12"×12"× 2" sample 22° C. at 50% relative humidity)

Compression Load Deflection at 50% compression=1.8 kPa in one embodiment. 3.03 kPa in another embodiment, and 1.8 to 3.03 kPa in a further embodiment (as measured per ASTM D3574C Modified)

However, any other suitable type of foam or non-foam compressible material (e.g., rubber, moldable gel, etc.) may alternately be employed for forming compressible blocks 430 and 432 that is suitable for forming an airflow seal around inserted cable/s 402 when cable channel 412 is closed. Moreover resistance to compression of the compressible material may be varied to fit a given application, e.g., lower values of compression resistance may be selected to provide less resistance to insertion of multiple cables 402.

Figure 2:
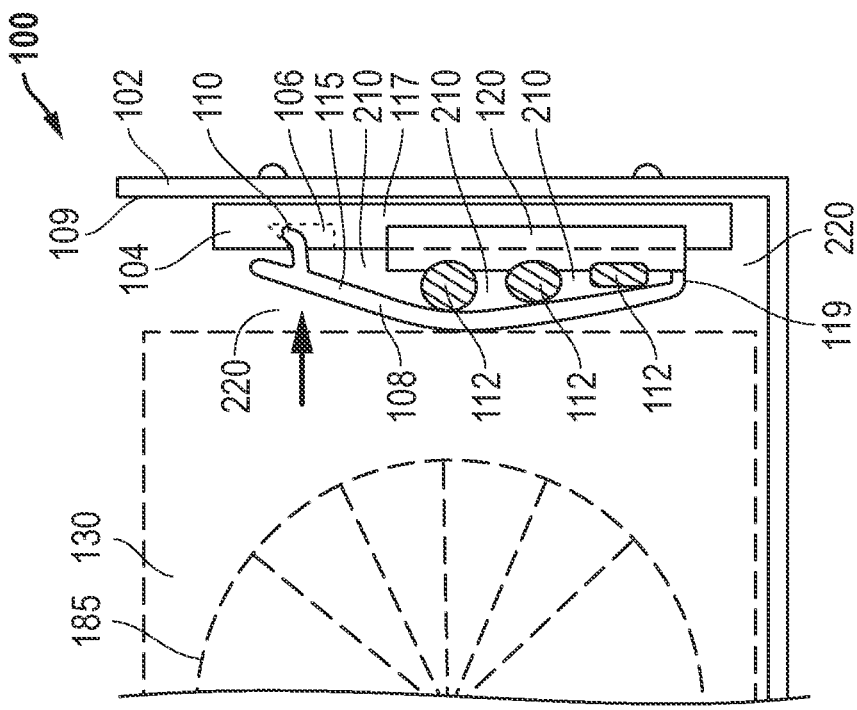
FIG. 2 illustrates a simplified front end view of a conventional chassis enclosure.
Figure 1:
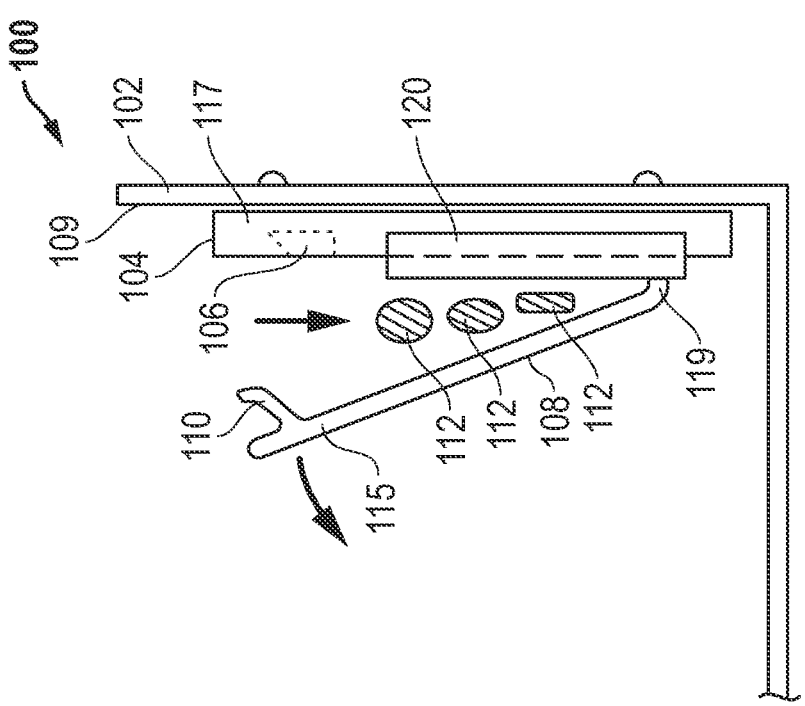
FIG. 1 illustrates a simplified front end view of a conventional chassis enclosure.
Figure 3:
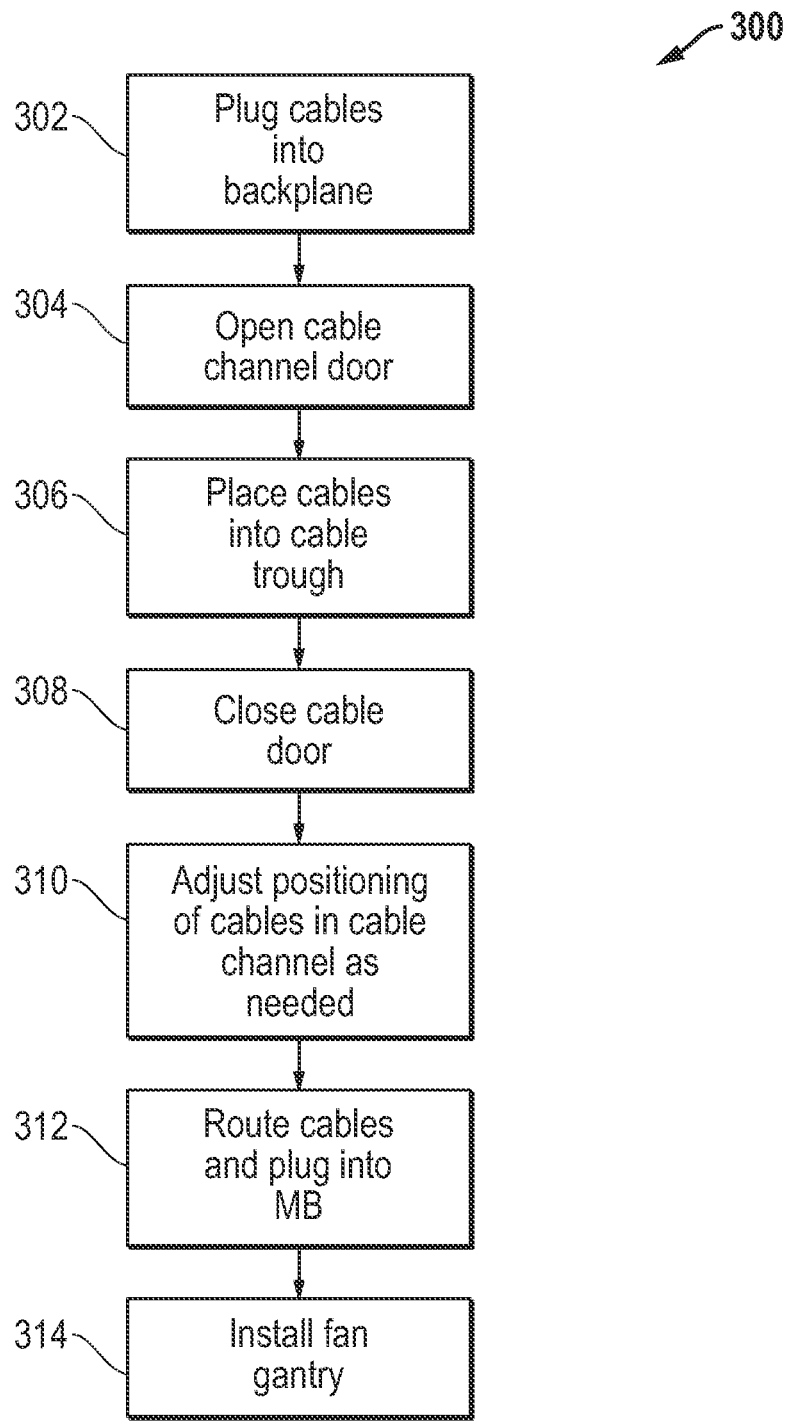
FIG. 3 illustrates conventional methodology.
Figure 5:
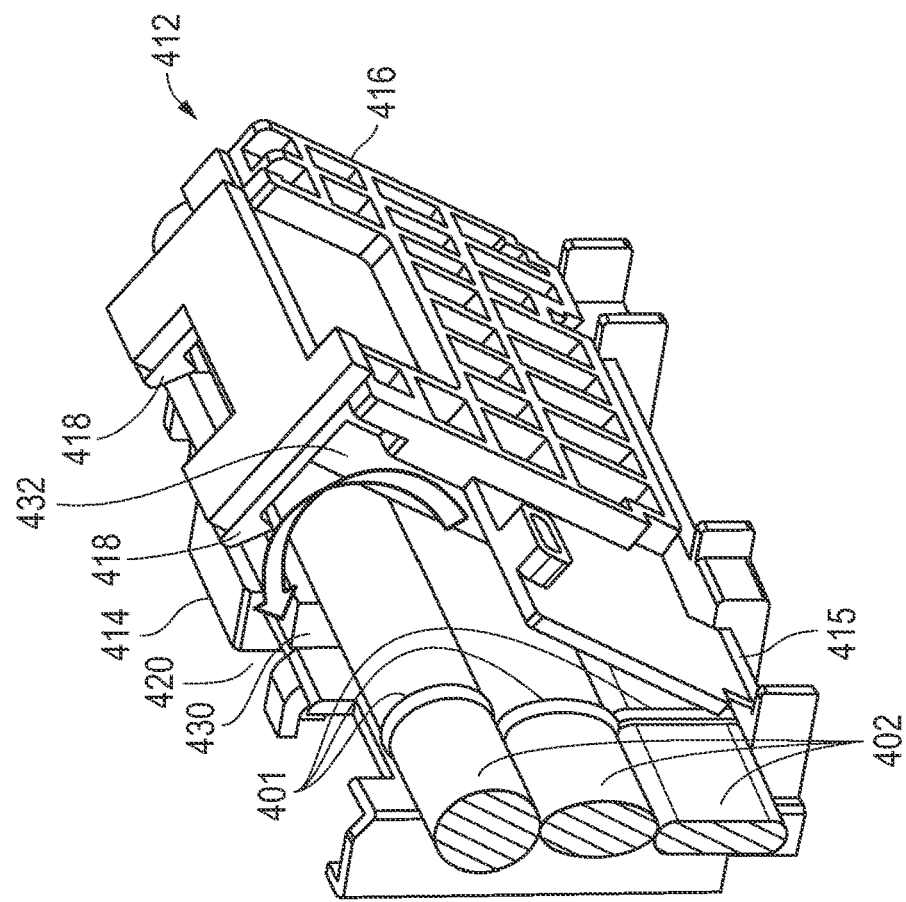
FIG. 5 illustrates a front perspective view of a cable channel according to one exemplary embodiment of the disclosed apparatus and methods.
Figure 7A:
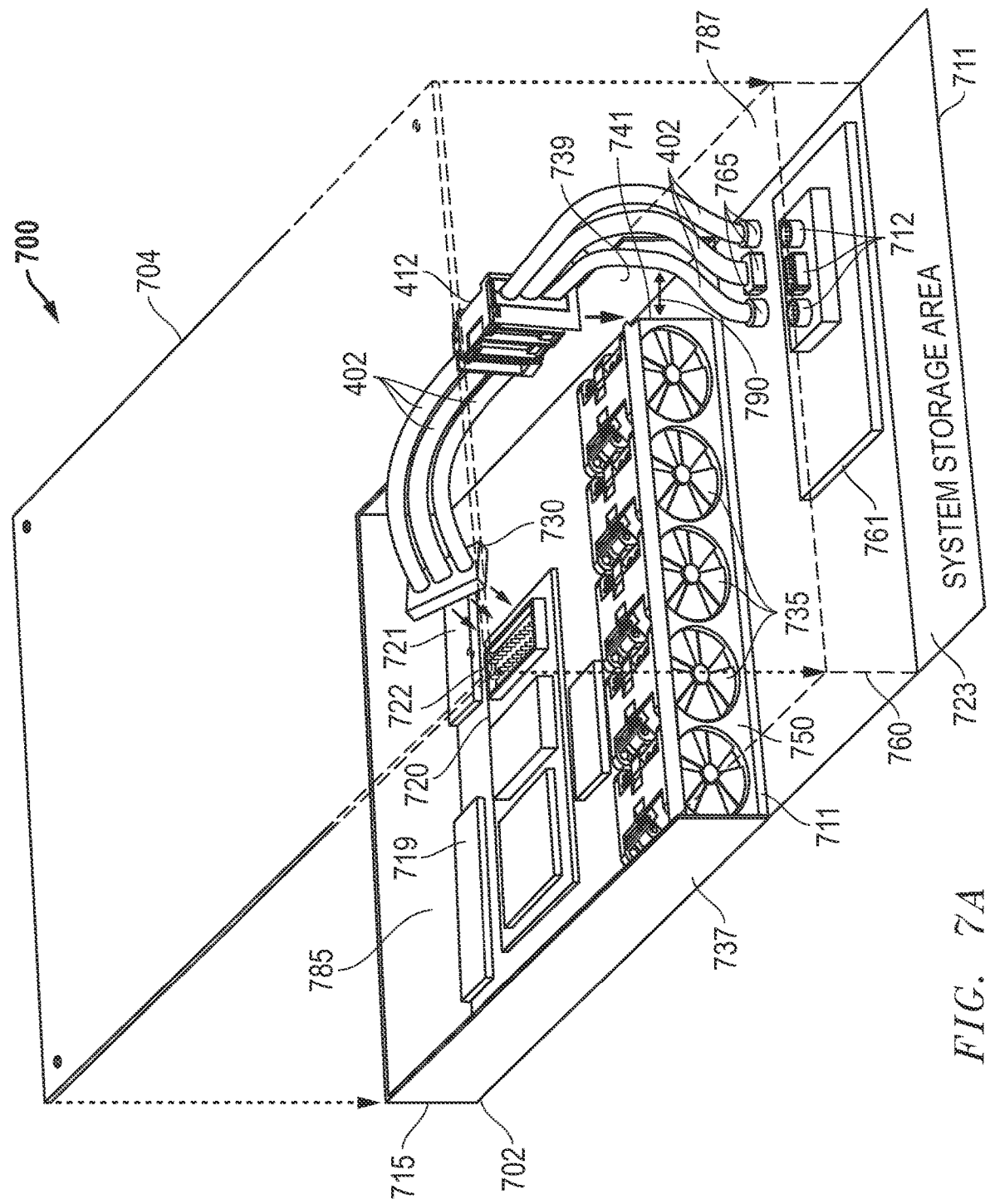
FIG. 7A illustrates an exploded front perspective view of an information handling system chassis according to one exemplary embodiment of the disclosed apparatus and methods.
Figure 7B:
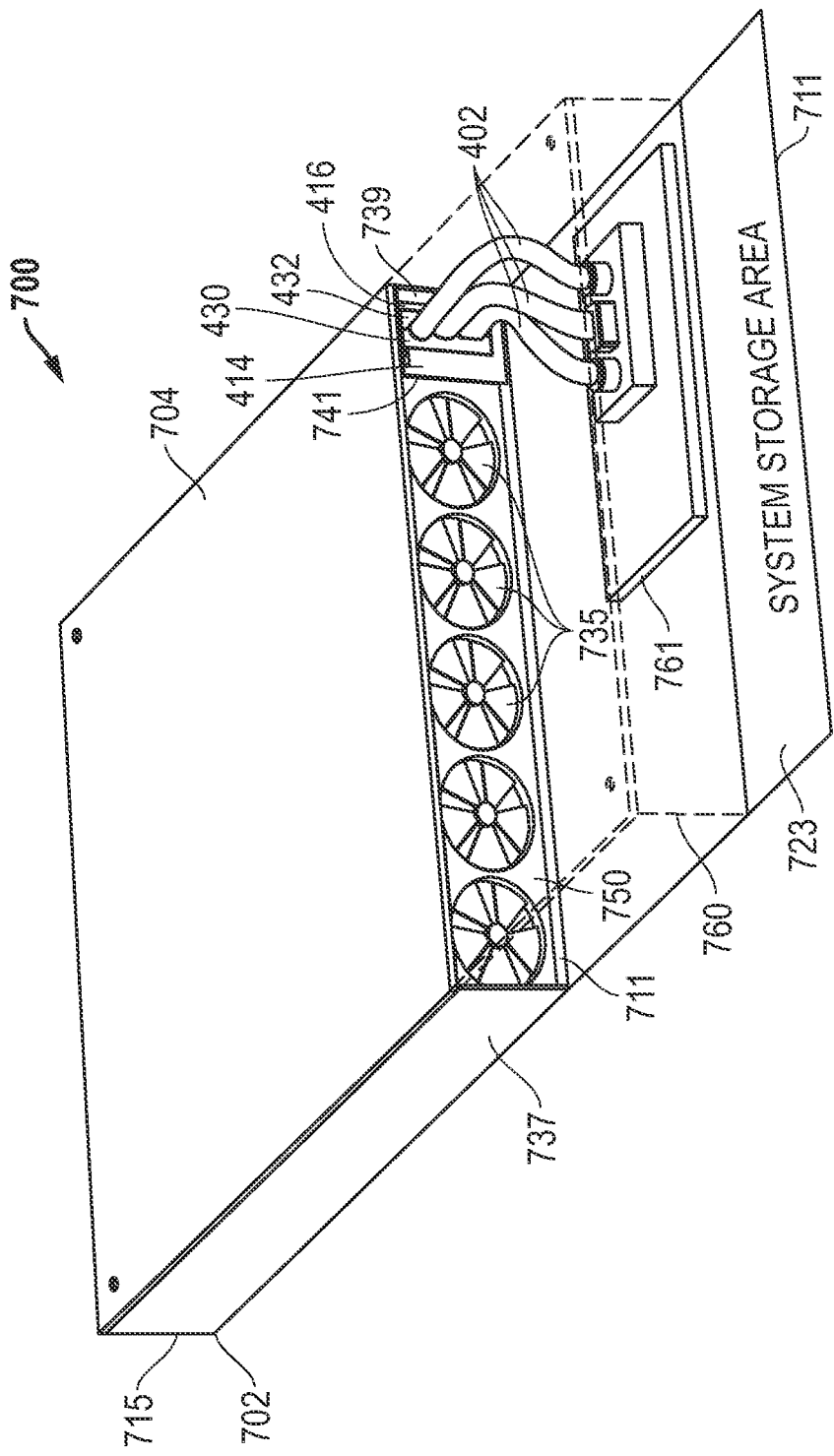
FIG. 7B illustrates a front perspective view of an information handling system chassis according to one exemplary embodiment of the disclosed apparatus and methods.

As shown in FIG. 4, cables 402 may be inserted into the open cable channel 412 in the direction of the arrows, with each of cables 402 extending outward from the front and rear of cable channel 412. FIG. 5 shows a front perspective view of cable channel 412 with cables 402 shown after such insertion into cable channel 412. As shown in FIGS. 4 and 5, alignment markings 401 (e.g., ink, paint, raised surface, surface indicia, etc.) may be optionally placed on outer surface of each of cables 402, and used as a guide to properly align the longitudinal position of each cable 402 relative to the cable channel 412 in order to achieve proper positioning of cables 402 relative to an information handling system chassis when the cable channel 412 is subsequently placed with clamped cables 402 into the chassis, e.g., as shown in FIGS. 7A and 7B.

FIG. 5 also shows how hinged cable clamp 416 may be rotated about its hinge 415 in the direction of the arrow to bring the cable clamp 416 together with the cable champ body 414 around the inserted cables 402. Although three cables 402 are illustrated in FIG. 4, it will be understood that more or less than three cables 402 may be inserted into a cable channel 412, with the maximum number of cables 402 that may be so inserted limited only by availability of sufficient space for the inserted cables 402 between hinged clamp 416 and body 414 to allow cable channel 412 to be physically closed.

Figure 6A:
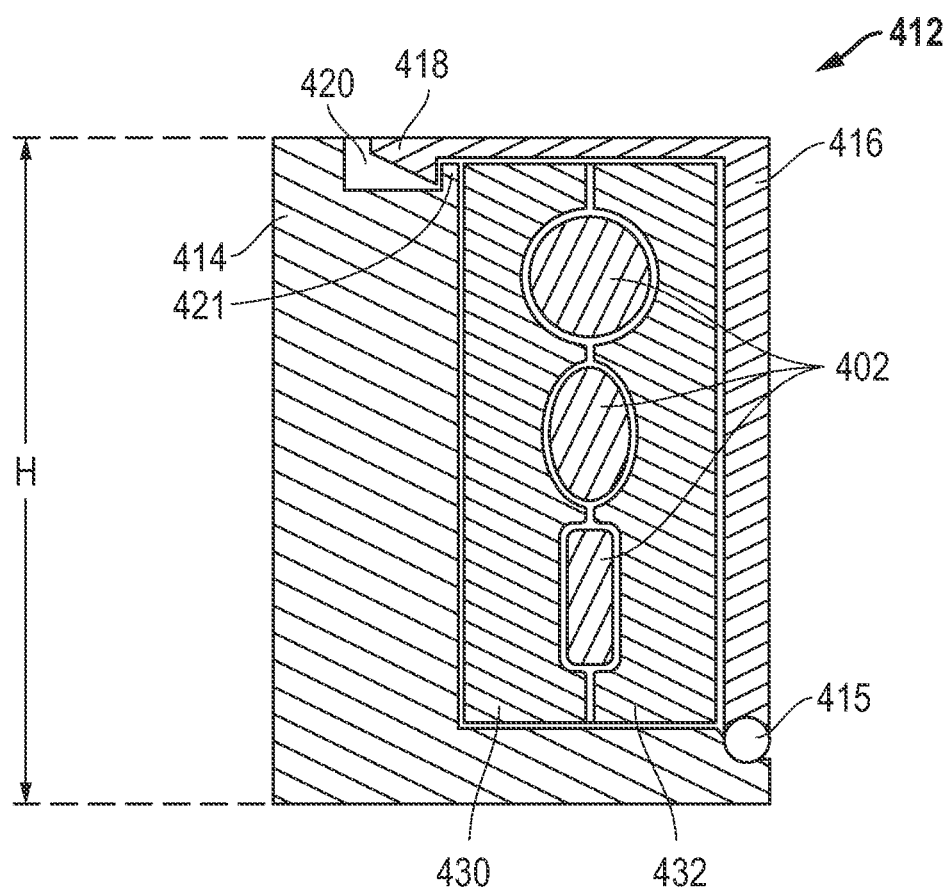
FIG. 6A illustrates a front end cross-sectional view of a cable channel according to one exemplary embodiment of the disclosed apparatus and methods.

FIG. 6A illustrates a front end cross-sectional view of the cable channel 412 of FIGS. 4 and 5 in a closed position, showing cable clamp 416 brought completely together with the cable channel body 414 around the inserted cables 402, with cable clamp 416 retained in this closed position by contact of a vertical step of each of two latch tangs 418 of the cable clamp 416 with a respective mating latch wall or post 421 defined within a respective one of two mating latch receptacles 420 of cable channel body 414. As shown, each respective latch tang 418 also includes a ramped surface that is displaced upwards (to bend the resilient plastic latch tang 418 upwards) by contact with a mating latch wall or post 421 when the cable clamp 416 is brought together with the cable channel body 414 until the respective vertical step of the latch tang 418 is displaced past the latch wall or post 421 which allows the bent compressible latch tang 418 to straighten and rebound downward to trap its vertical step behind the mating latch wall or post 421. It will be understood that particular configuration of latch tangs 418 and mating latch receptacles 420 shown in FIG. 6A is exemplary only, and that any other type and number of one or more mating mechanisms may be employed that is suitable to latch together the cable clamp 416 and cable channel body 414 around cables 402.

Still referring to FIG. 6A, each of first compressible block 430 and second compressible block 432 are compressed or deformed around a respective portion (e.g., side) of each cable 402 in those areas where a cable 402 is present and contacts the first compressible block 430 or second compressible block 432, and which, when the shell of cable channel 412 is closed, are fully enclosed internally to the cable channel 412. First compressible block 430 and second compressible block 432 also contact and compress against each other in those areas where no cable 402 is present. Each of first compressible block 430 and second compressible block 432 snugly conform to the outer surface of each cable 402 where the cable is present (and snugly contact each other where no cable 402 is present) so as to fully encase the inserted sides of cables 402 and form a complete seal (e.g., with no air gaps) that prevents airflow across the closed cable channel 412 in a direction parallel to the longitudinal axes of the cables 402. Moreover, in the embodiment shown in FIG. 6A, the mated latch tangs 418 of the cable clamp 416 latch walls or posts 421 each have a low profile that reside within the overall shell height (outer height dimension "H") of the cable channel 412, enabling a seal over the entire height of the cable channel 412 and creating a seal that prevents airflow across the entire height "H" of the closed cable channel 412, i.e., prevents airflow through closed cable channel 412 in a direction perpendicular to the page in FIG. 6A.

Figure 6B:
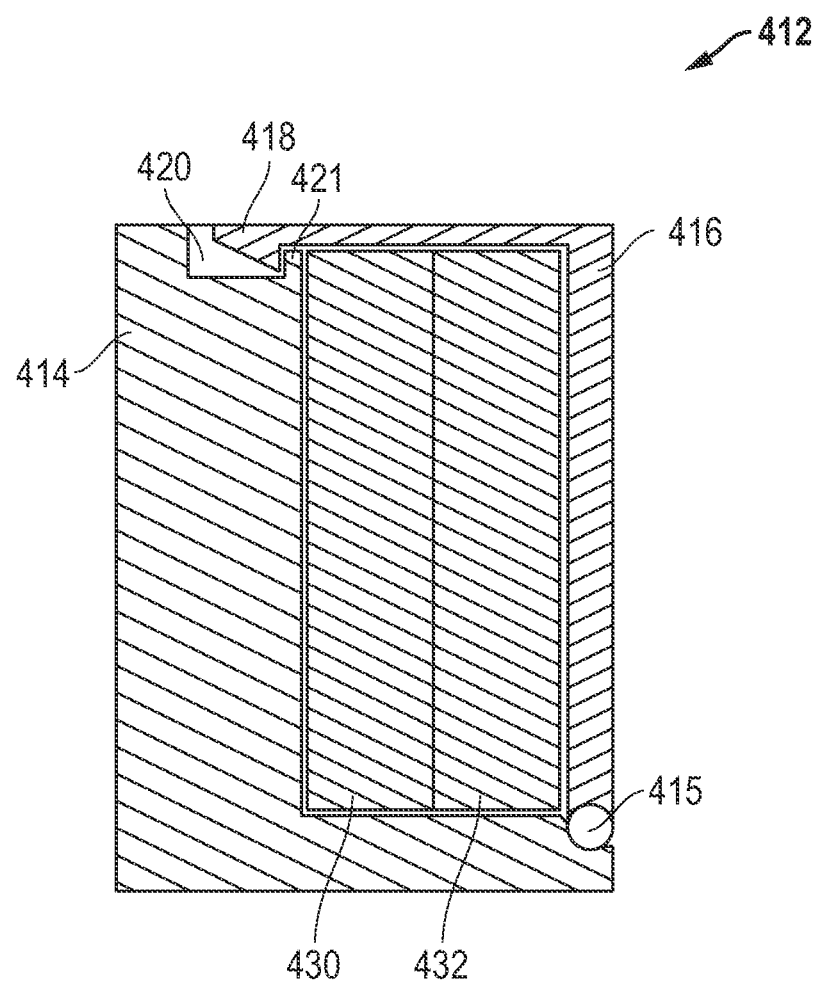
FIG. 6B illustrates a front end cross-sectional view of a cable channel according to one exemplary embodiment of the disclosed apparatus and methods.
Figure 7C:
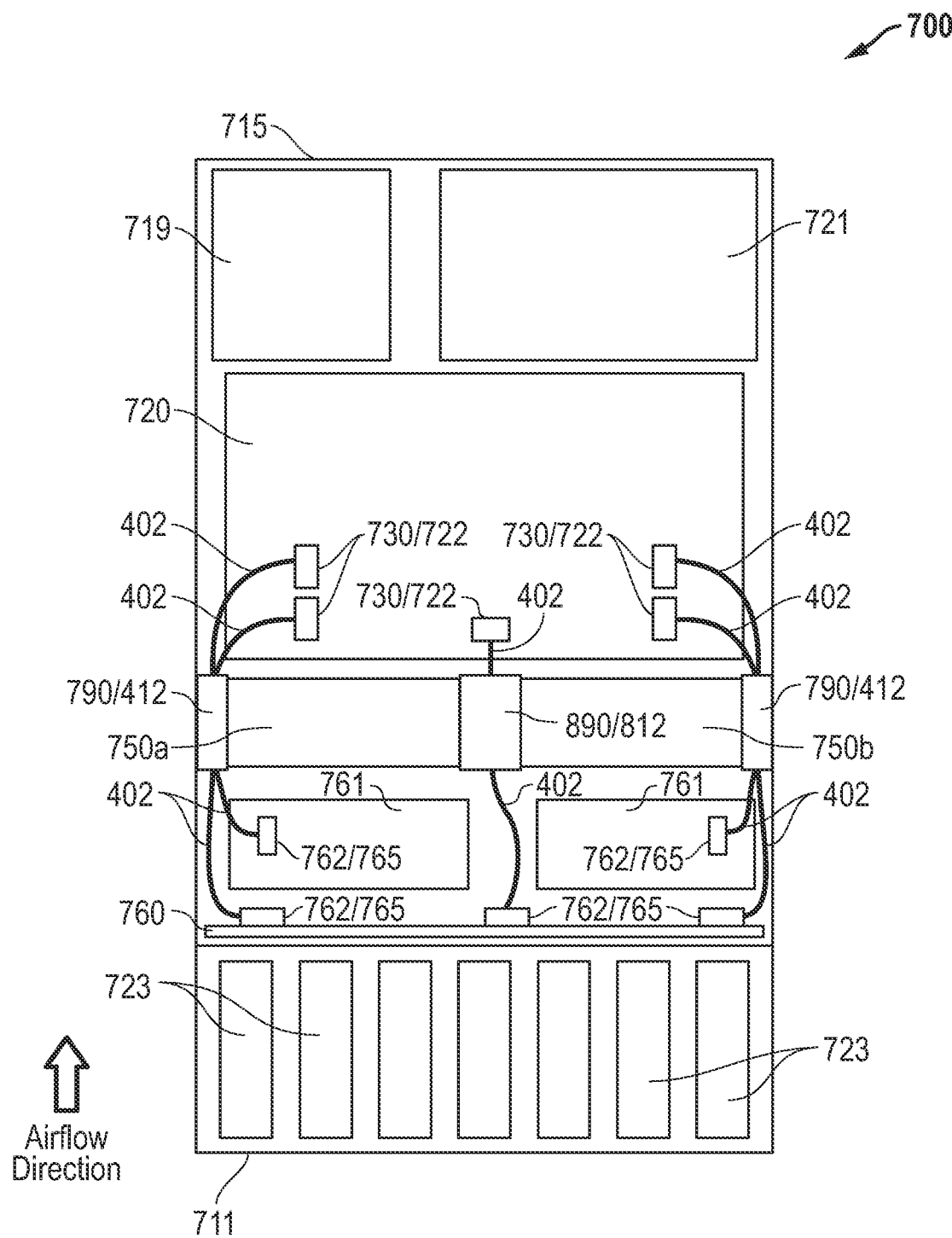
FIG. 7C illustrates a front perspective view of an information handling system chassis according to one exemplary embodiment of the disclosed apparatus and methods.

FIG. 6B illustrates a front end cross-sectional view of the cable channel 412 of FIGS. 4 and 5 in a closed position, showing cable clamp 416 brought completely together with the cable channel body 414 with no cables inserted cables 402. In FIG. 6B, the entire inner face of first compressible block 430 is in contact with (e.g., slightly interferes with) the entire inner face of second compressible block 432 since no cable 402 to form a complete seal that prevents airflow across the closed cable channel 412 in a direction perpendicular to the page in FIG. 6B. As also shown, each of blocks 430 and 432 are fully enclosed internally within the shell of cable channel 412, FIG. 7A illustrates an exploded front perspective view of an information handling system chassis 700 (e.g., stamped sheet metal 1U chassis) with its top cover 704 removed from chassis base 702 to allow one end of each of system cables 402 to be connected to circuitry and components on system motherboard 720 disposed inside a first enclosed cavity or compartment 785 of chassis 700, e.g., in this case by joining together mating electronic connectors 730 and 722 within the cavity 785 of enclosure of chassis 700. As further shown, the other end of each of system cables 402 may be electrically connected to PCB board/s 761 and/or connectors of backplane 760 that are mechanically attached to chassis 700 within a second enclosed cavity or compartment 787 at or near the front end 711 of chassis 700 as shown in FIG. 7C, e.g., by joining together mating electronic connectors 762 and 765. For purposes of illustration, those chassis walls (e.g., sidewalls and end walls of chassis 700) and portion of top cover 704 that are positioned between fan gantry 750 and front end 711 of chassis 700 are shown with dashed lines.

As further shown in FIG. 7A, a fan gantry 750 with its multiple integrated cooling fans 735 is disposed in position adjacent the front end 711 of system 100, and extends from a first chassis sidewall 737 across a majority of the internal width of system 700 to a position near an opposing second chassis sidewall 739 as shown, and so as to separate first enclosed cavity 785 from a second enclosed compartment or cavity 787 which contains the backplane 760 and other PCB/s 761. Cooling fans 735 operate to draw ambient air into the first cavity 785 of chassis enclosure and expel it frontward into the second cavity or compartment 787 of the system chassis 700 as shown in FIG. 7C, although air circulation direction may be either front-to-rear or rear-to-front depending on characteristics and needs of a given system configuration. An area for system storage 723 (e.g., hard drives, solid state drives (SSD) etc.) is illustrated at the front end 711 of system 700, although the actual storage drives shown in FIG. 7C are omitted from FIGS. 7A and 7B for purposes of illustration. Other components (e.g., power supplies 719, input/output components 721, etc.) may be provided in cavity 785 adjacent the rear end 715 of system 700 as shown in FIG. 7C.

In one embodiment, fan gantry 750 may be permanently fixed to the chassis 700 itself, and cannot be detached or otherwise removed from the rest of the chassis (e.g., 1U computer chassis). However, in other embodiments, a detachable fan gantry 750 may be employed, in which case the detachable fan gantry 750 may be installed and secured (e.g., temporarily fixed with fasteners) in the illustrated position within chassis 700 prior to installation of a closed cable channel 412. Further alternatively, a cable channel 412 may be installed within an information handling system chassis whether or not a fan gantry is present or absent within the chassis, e.g., cable channel 412 may be installed in a space defined between existing chassis structures (e.g., adjacent interior and/or exterior chassis walls) of an information handling system chassis that is sized to receive the cable channel 412. Information regarding information handling systems including a system board (e.g., motherboard) may be found described, for example, in U.S. patent application Ser. No. 16/988,021, filed Aug. 7, 2020, which is incorporated herein by reference in its entirety for all purposes.

Still referring to FIG. 7A, a fixed side opening (fixed open section or open space) 790 that is complementary shaped and dimensioned to a closed cable channel 412 so as to receive the closed cable channel 412 in slidably inserted airtight relationship is defined as shown at the front end of chassis 700 between one side or end 741 of the permanently fixed fan gantry 750 and the adjacent permanently fixed chassis sidewall 739. As shown, open space 790 extends completely from the near the front end 711 of the chassis 700 to the interior cavity 785 of the chassis 790. In FIG. 7A, a closed cable channel 412 is shown positioned for insertion (or drop-in) vertically downward in the direction of the arrow into open space 790 without the need for any fasteners such as hooks, snaps or other retention features. In one embodiment, cable channel 412 may have a front-to-back length that is equal to the entire depth dimension of side opening 790, i.e., so that cable channel 412 extends into chassis 700 the entire depth of side opening 790 when cable channel 412 is received within side opening 790. In the illustrated embodiment of FIG. 7A, cable channel 412 is shown closed around cables 402, with cable clamp 416 brought completely together with the cable channel body 414 around the inserted cables 402, e.g., such as illustrated in FIG. 6A.

FIG. 7B illustrates a front perspective view of the chassis embodiment 700 of FIG. 7A, after insertion of closed cable channel 412 into open space 790 and assembly of top cover 704 to the chassis base 702 (e.g., with optional top cover fasteners such as screws). As shown, height and width dimensions of closed cable channel 412 take up (or equal) the entire respective height and width of the open space 790 so that airflow is blocked between the outer periphery of cable channel 412 and the inner surfaces of open space 790 and top cover 704. When chassis 700 is closed in this way, the enclosed cavity 785 of chassis 700 encloses internal information handling system components, e.g., system motherboard 720 including central processing unit "CPU" and system memory (e.g., DRAM), as well as other possible internal electronic components such as baseboard management controller (BMC), etc. Top cover 704 overlies, contacts, and forms a seal against airflow with the top of installed cable channel 412 and completes the seal against airflow recirculation that is made all around the outer peripheral sides of cable channel 412. Top cover 704 also serves to retain cable channel 412 in place within open space 790.

In the assembled configuration of FIG. 7B, closed cable channel 412 is received tightly between the permanently fixed outer surface of fan gantry 750 and the fixed inner surface of second chassis sidewall 739 so as to form a seal that prevents airflow recirculation to the outside ambient environment from the interior cavity 785 of the assembled chassis 700 through open space 790 and the closed cable channel 412 in a direction parallel to the longitudinal axes of the cables 402. In this regard, the outer side contours of the shell of cable channel 412 (e.g., both cable clamp 416 and cable champ body 414) may be molded to conform to and tightly fit within any irregular contours of the sides of open space 790 of chassis 700, i.e., so as to contact and form a seal with inside surfaces of chassis 700 to prevent airflow recirculation through open space 790.

Although FIG. 7B illustrates an embodiment with a cable channel 412 installed within a 1U chassis 700 having a permanently fixed fan gantry 750, a cable channel 412 may be installed within other sizes and configurations of information handling system chassis. Examples of such other chassis configurations include larger system chassis sizes such as 2U, 4U, etc. and/or with chassis configurations having a temporarily fixed and removable fan gantry. Moreover, it is also possible that a cable channel may be installed within a designated open space positioned adjacent any other side or end of an information handling system chassis (e.g., front end, either side ends, chassis top or bottom) to provide a sealed routing path for system cable/s into the chassis interior.

In one alternate embodiment, a cable channel 412 may be attached to a sidewall of a 2U chassis (e.g., by suitable fasteners) prior to installation of a removable fan gantry and prior to insertion of cables 402 into open cable channel 412. Cables 402 may then be inserted into the opened cable channel 412 while it is attached to the 2U chassis sidewall, an then cable channel 412 closed around the inserted cables 402. A removable fan gantry section may then be installed adjacent the cable channel 412, with an end surface of the fan gantry section contacting one side of cable channel 412 and the chassis sidewall contacting the opposing side of the cable channel 412 to form a seal against airflow recirculation out from (or into) the closed 2U chassis during system operation.

FIG. 7C illustrates an overhead view of an information handling system chassis 700. As shown in FIG. 7C, the other end of each of system cables 402 may be electrically connected to a backplane 760 and/or other printed circuit boards 761 that are mechanically connected to the front end 711 of chassis 700 (see FIG. 7C), e.g., by joining together mating electronic connectors 762 and 765. As further shown in FIG. 7A, two separate fan gantry sections 750a and 750b are disposed in position adjacent the front end 711 of system 100. One end of fan gantry section 750a is spaced apart from a first chassis sidewall to define a first open space 790 receiving a first cable channel 412, and one end of fan gantry section 750b is spaced apart from a second and opposing chassis sidewall to define an open space 790 receiving a second cable channel 412. A center or intermediate open space 890 receiving a third cable channel 812 is defined between two adjacent ends of fan gantries 750a and 750b. Cooling fans of fan gantries 750a and 750b operate to draw ambient from the front end 711 of the chassis enclosure for blowing through cavity 785 chassis 700 (e.g., a 1U server chassis), although air circulation direction may be either front-to-rear or rear-to-front depending on characteristics and needs of a given system configuration. An area for system storage 723 (e.g., hard drives, solid state drives (SSD) etc.) is illustrated at the front end 711 of system 700. Other components (e.g., power supplies 719, input/output components 721, etc.) are provided as shown at the rear end 715 of system 700 as shown in FIG. 7C.

Figure 8A:
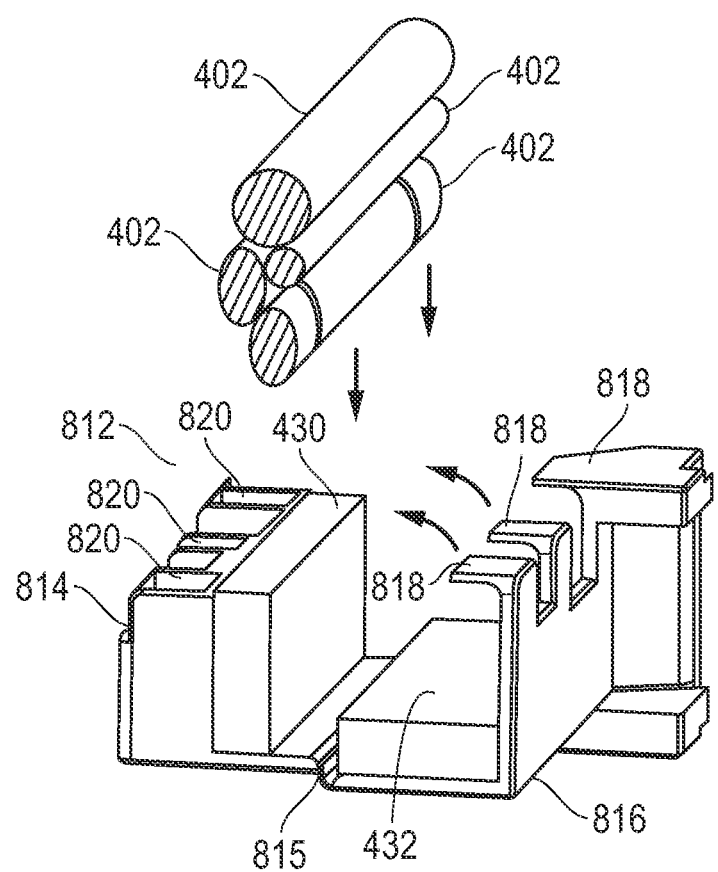
FIG. 8A illustrates a front perspective view of a cable channel according to one exemplary embodiment of the disclosed apparatus and methods.

FIG. 8A illustrates a front perspective view of another embodiment of an opened cable channel 812 that is configured for installation within an intermediate opening of an information handling system chassis. In FIG. 8A, cable channel 812 is positioned separate from an information handling system 800 and is positioned to receive multiple cables 402 of different exemplary cross-sectional shapes. In the embodiment of FIG. 8A, cable channel 812 is configured as shown with a hinged clamp 816 that is attached by a hinge 815 to a body 814 of the cable channel 812. As with the embodiment of FIG. 4, cable channel 812 includes a first block 430 of resilient material that is attached to the inner surface of cable channel body 814, and a second block 432 of compressible material attached to the inner surface of cable channel clamp 816 as shown. In the opened position of FIG. 8A, cables 402 may be inserted into the open cable channel 812 in the direction of the arrows, e.g., in a manner as previously described in relation to the embodiment of FIGS. 4 and 5.

In the embodiment of FIG. 8A, two latch tangs 818 of the cable clamp 816 are provided to mate with respective latch receptacles 820 of cable channel body 814, each of which are shaped and dimensioned to receive one of latch tangs 818 in clamped relationship. As with the embodiment of FIG. 6A, the particular configuration of latch tangs 818 and mating latch receptacles 820 shown in FIG. 8A is exemplary only, and that any other type and number of one or more mating mechanisms (e.g., such as illustrated in the embodiment of FIG. 6A) may be employed that is suitable to latch together the cable clamp 816 and cable channel body 814 around cables 402.

Figure 8B:
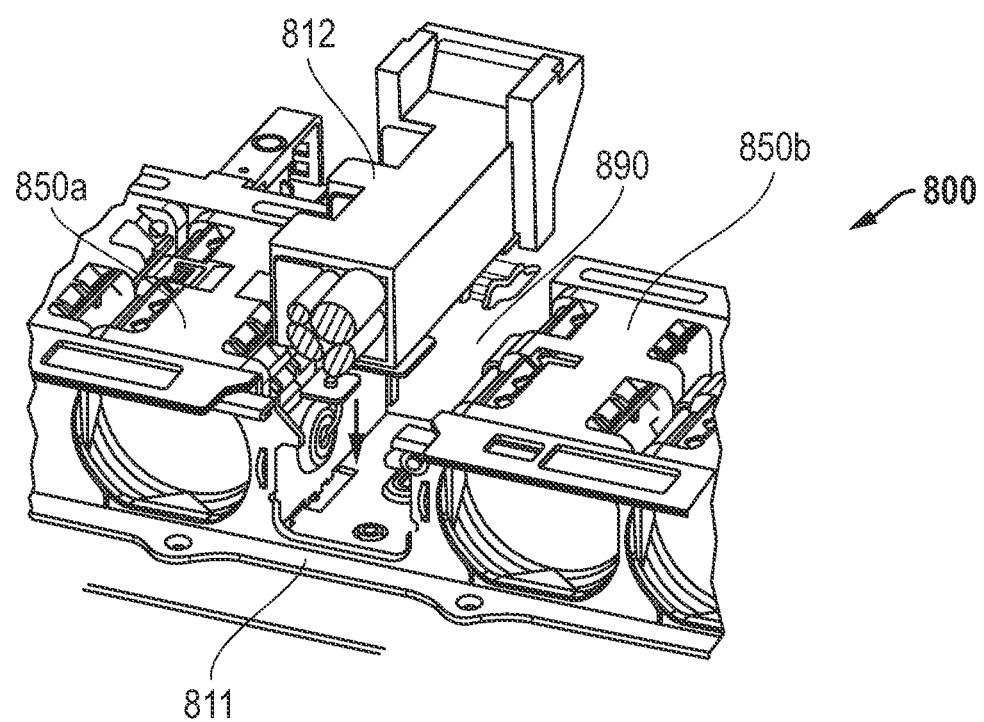
FIG. 8B illustrates a partial front perspective view of an information handling system chassis according to one exemplary embodiment of the disclosed apparatus and methods.

FIG. 8B illustrates an exploded partial front perspective view of a 1U information handling system chassis 800 with its top cover removed to allow insertion of closed cable channel 812 into a fixed intermediate opening (or fixed open section or open space) 890 that is shaped and dimensioned to receive closed cable channel 812 in inserted airtight relationship. As shown in this embodiment, intermediate opening 890 is defined as an opening located intermediate (e.g., in this case centered) between the two opposing sidewalls of chassis 800 and between two permanently fixed fan gantry sections 850a and 850b that are not removable from chassis 800, although an intermediate opening may alternately be defined between fixed fan gantry sections in a non-center location that is closer to one sidewall of chassis 800 than it is to the other sidewall of chassis 800. As shown, open space 890 extends completely from a first compartment or cavity at the front end 811 of the fan gantry sections 850a and 850b to a second and different interior cavity or compartment of the chassis 800 that lies rearward and on the opposite side of the fan gantry sections 850a and 850. In FIG. 8B, closed cable channel 812 is shown positioned for insertion downward in the direction of the arrow into open space 890. In the illustrated embodiment of FIG. 8B, cable channel 812 is closed around cables 402 with cable clamp 816 brought completely together (about hinge 815) with the cable channel body 814 around the inserted cables 402, e.g., in similar manner as illustrated and described for the embodiment of FIG. 6A.

As described in relation to the embodiment of FIG. 6A, each of first compressible block 430 and second compressible block 432 of FIG. 8B are compressed or deformed around a respective portion (e.g., side) of each cable 402 in those areas where a cable 402 is present and contacts the first compressible block 430 or second compressible block 432, and first compressible block 430 and second compressible block 432 also contact each other in those areas where no cable 402 is present. This forms a seal that prevents airflow across the closed cable channel 812 in a direction parallel to the longitudinal axes of the cables 402, and the mated latch tangs 818 and latch receptacles 820 each have a low profile that reside within the overall shell height (outer height dimension "H") of the cable channel 812, creating a seal that prevents airflow through closed cable channel 812. Similar to the embodiment of FIG. 7B, when the closed cable channel 812 is received tightly between the fan gantry sections 850a and 850b, it forms a seal that prevents airflow recirculation to the outside ambient environment from the interior cavity of the assembled chassis 800 through open space 890 and the closed cable channel 812.

Figure 8C:
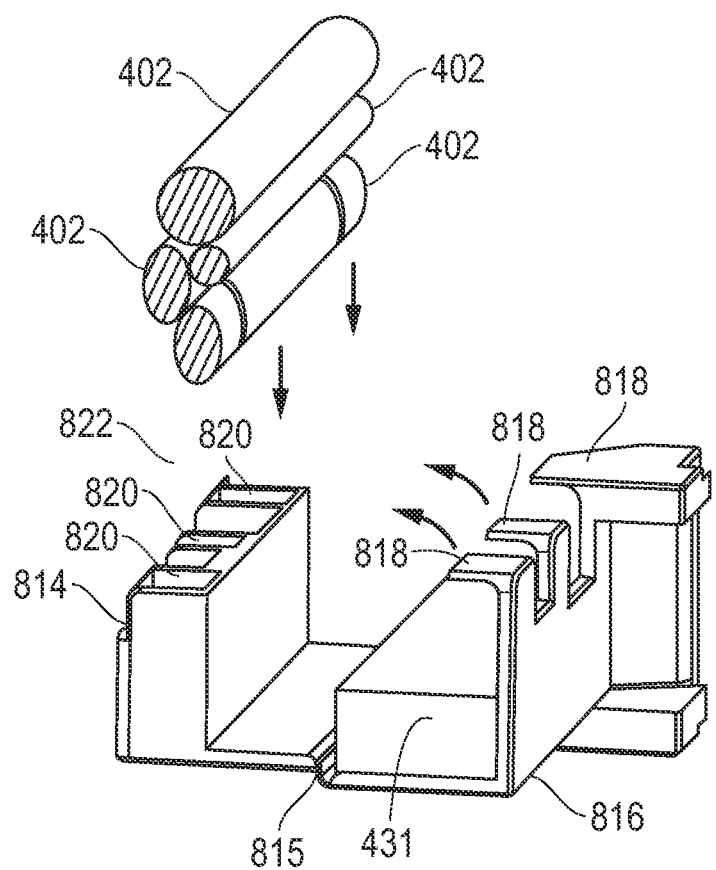
FIG. 8C illustrates a front perspective view of a cable channel according to one exemplary embodiment of the disclosed apparatus and methods.

FIG. 8C illustrates a rear perspective view of another embodiment of an opened cable channel 822 that is configured for installation within an intermediate opening of an information handling system chassis. In FIG. 8C, cable channel 822 is positioned separate from an information handling system 800 and is positioned to receive multiple cables 402 of different exemplary cross-sectional shapes. In the embodiment of FIG. 8C, cable channel 822 is configured as shown with a hinged clamp 816 that is attached by a hinge 815 to a body 814 of the cable channel 812. In this embodiment, cable channel 822 includes a single block 431 of compressible material attached to the inner surface of cable channel clamp 816 as shown. In the opened position of FIG. 8C, cables 402 may be inserted into the open cable channel 822 in the direction of the arrows, e.g., in a manner as previously described in relation to the embodiment of FIGS. 4 and 5. Then hinged cable clamp 816 of FIG. 8C may be rotated about its hinge 815 in the direction of the arrow to bring the cable clamp 816 and single block 431 of compressible material together with the cable champ body 814 around the inserted cables 402 to fully encase the inserted sides of cables 402 and form a complete seal around the cables 402 and the opposing inner surface of cable channel body 814 of closed cable channel 822 as shown in FIG. 8E.

Figure 8D:
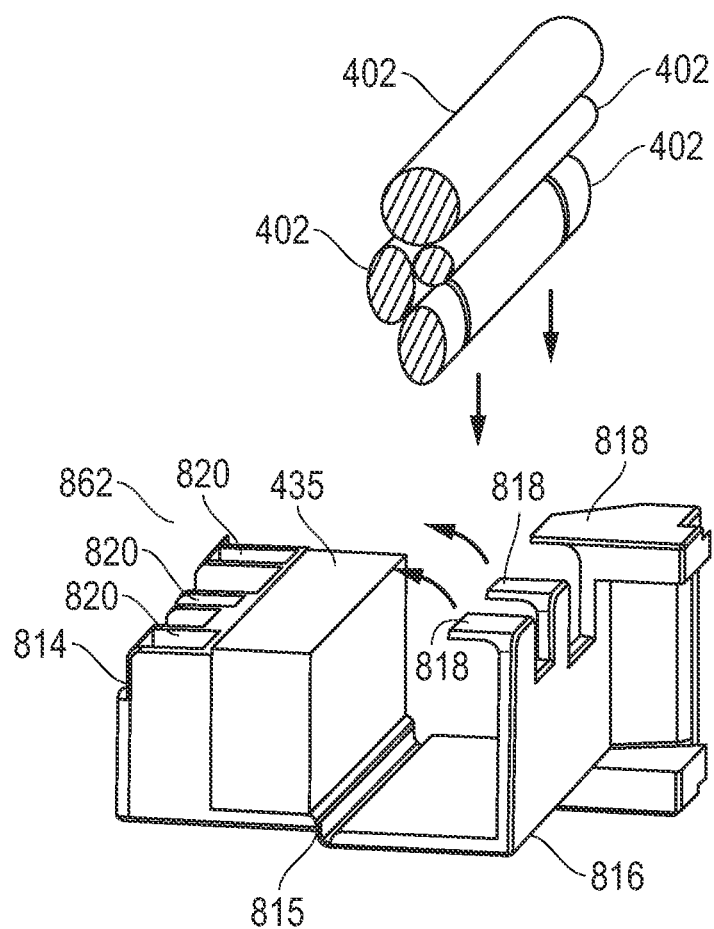
FIG. 8D illustrates a front perspective view of a cable channel according to one exemplary embodiment of the disclosed apparatus and methods.
Figure 8E:
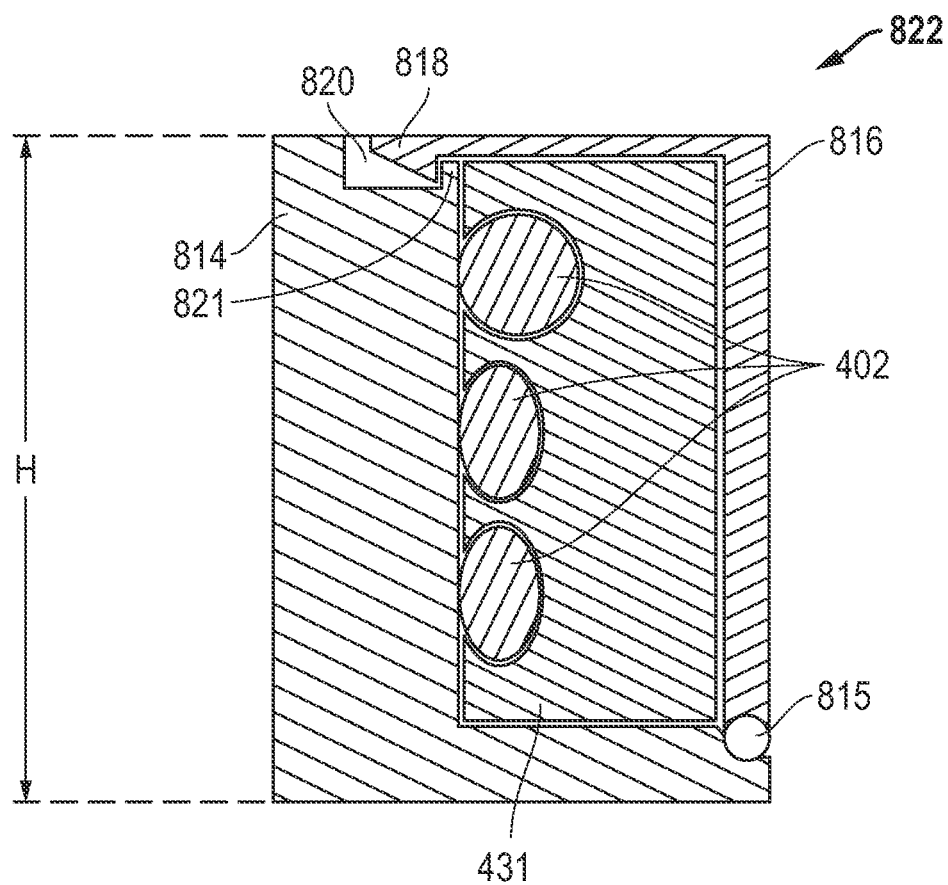
FIG. 8E illustrates a front end cross-sectional view of a cable channel according to one exemplary embodiment of the disclosed apparatus and methods.
Figure 8F:
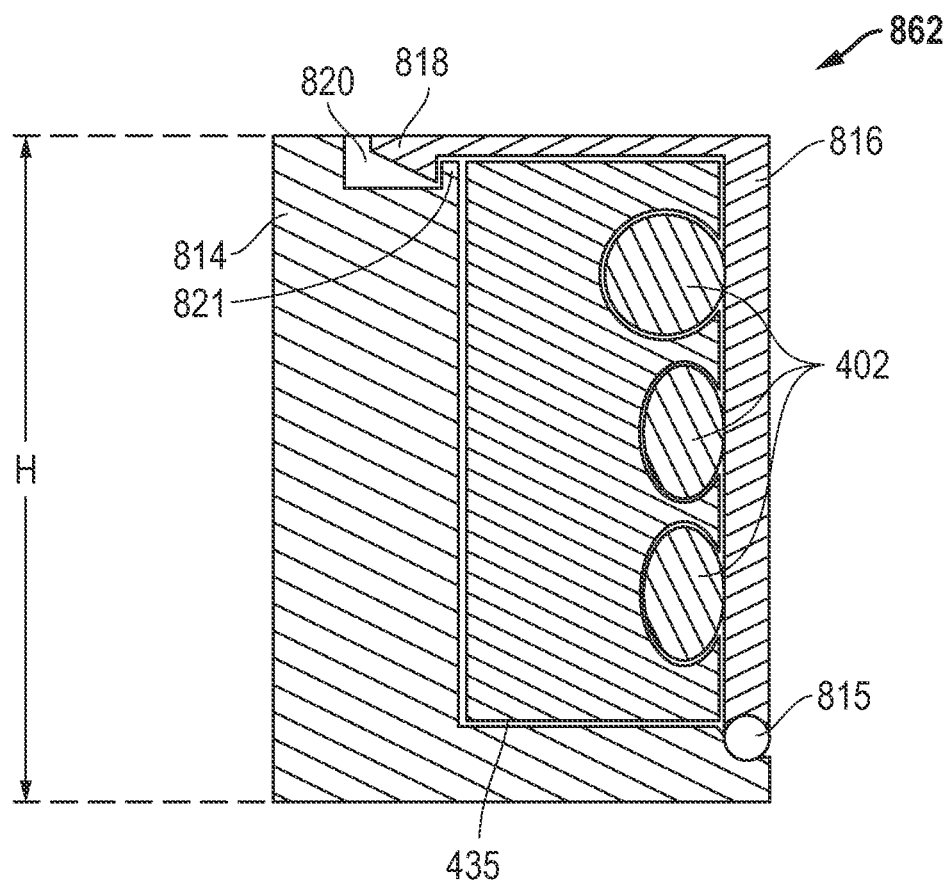
FIG. 8F illustrates a front end cross-sectional view of a cable channel according to one exemplary embodiment of the disclosed apparatus and methods.

FIG. 8D illustrates a rear perspective view of another embodiment of an opened cable channel 862 that is configured for installation within an intermediate opening of an information handling system chassis. In FIG. 8D, cable channel 882 employs a single block 435 of compressible material that is attached to the inner surface of the cable channel body 814, and into which cables 402 may be inserted into the open cable channel 862 in the direction of the arrows, e.g., in a manner as previously described in relation to the embodiment of FIGS. 4 and 5. Then hinged cable clamp 816 of FIG. 8D may be rotated about its hinge 815 in the direction of the arrow to bring the cable clamp 816 together with the cable champ body 814 and single block 435 of compressible material around the inserted cables 402 to encase the inserted sides of cables 402 and form a complete seal around the cables 402 and the opposing inner surface of cable clamp 816 of closed cable channel 862 as shown in FIG. 8F.

Figure 9:
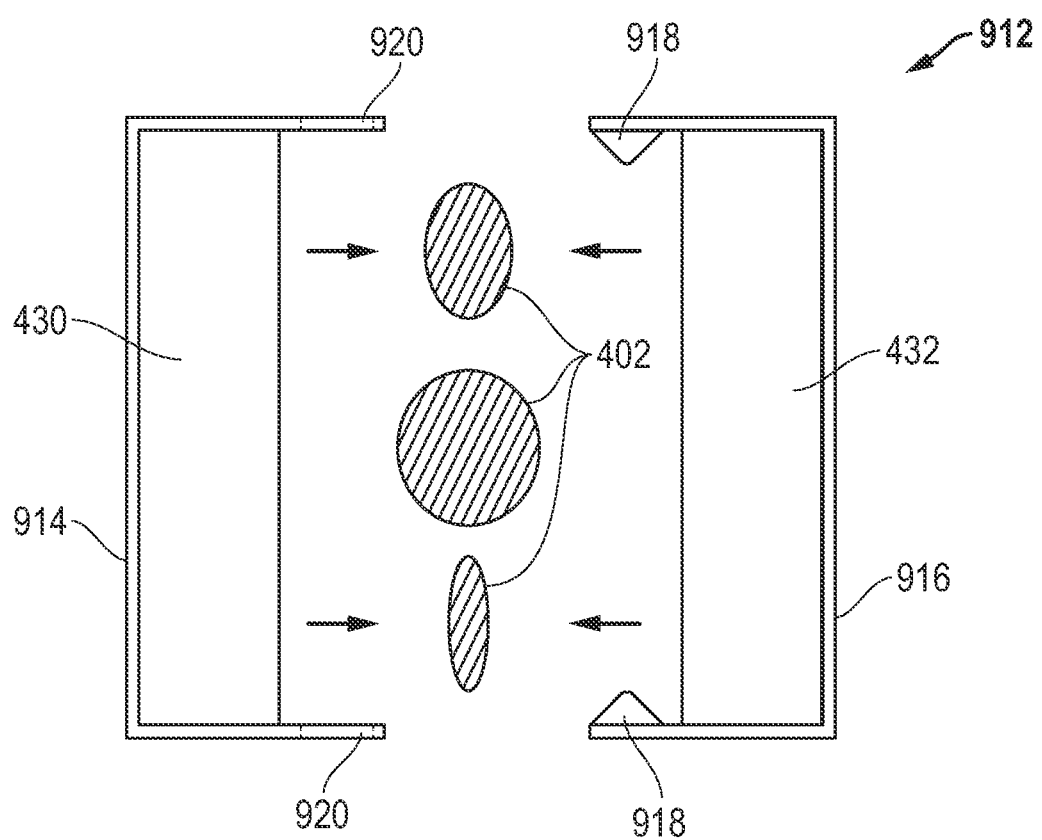
FIG. 9 illustrates a front end cross-sectional view of a cable channel according to one exemplary embodiment of the disclosed apparatus and methods.

FIG. 9 illustrates an embodiment of an opened two-piece cable channel 912 positioned to clamp together around multiple cables 402 of different exemplary cross-sectional shapes. In the embodiment of FIG. 9, cable channel 912 is configured as shown with a separate clamp 916 and separate body 914, and without a hinge joining clamp 916 to body 914. Two-piece cable channel 912 may be otherwise inserted in a closed condition within an side opening 790 or intermediate opening 890 in a manner similar to that previously described. As with the embodiment of FIG. 4, cable channel 912 includes a first block 430 of resilient material that is attached to the inner surface of cable channel body 914, and a second block 432 of compressible material attached to the inner surface of cable channel clamp 916 as shown. In the opened position of FIG. 9, cables 402 may be inserted as shown into the open cable channel 912.

In the embodiment of FIG. 9, two latch tangs 918 of the cable clamp 916 are provided in position to mate with respective latch receptacles 920 of cable channel body 914, each of which are shaped and dimensioned to receive one of latch tangs 918 in clamped relationship around inserted cables 402 when clamp 916 is brought together with cable channel body 914 around inserted cables 402 in the direction of the arrows. In this way, mated latch tangs 918 and latch receptacles 920 operate to latch and retain clamp 916 and cable channel body 914 in closed position around cables 402. As with the embodiment of FIG. 6A, the particular configuration of latch tangs 918 and mating latch receptacles 920 shown in FIG. 9 is exemplary only, and that any other type and number of one or more mating mechanisms (e.g., such as illustrated in the embodiment of FIG. 6A) may be employed that is suitable to latch together the cable clamp 916 and cable channel body 914 around cables 402.

Figure 10:
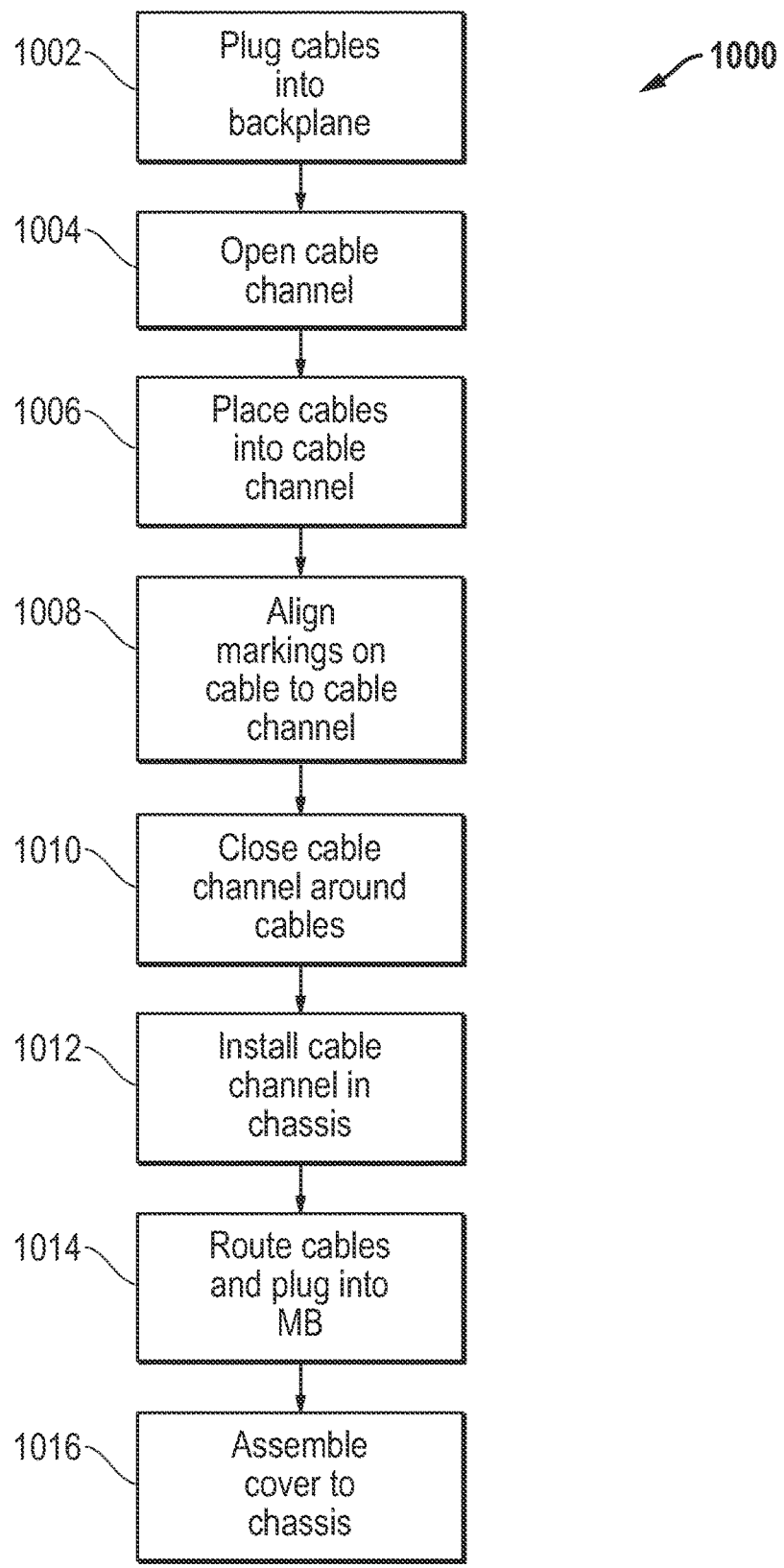
FIG. 10 illustrates methodology according to one exemplary embodiment of the disclosed apparatus and methods.

FIG. 10 illustrates a methodology 1000 that may be employed in one exemplary embodiment of the disclosed apparatus and methods. For purposes of illustration, methodology 1000 is described in relation to the cable channel embodiment 412 of FIG. 4, it being understood that methodology 1000 may be similarly employed using other cable channel embodiments, e.g., such as cable channel embodiments 812 or 912 described herein. Methodology 1000 begins in step 1002 where cables 402 may be first plugged into backplane 760, and embodiment of which is illustrated in FIG. 7A.

Next, in step 1004, cable channel 412 may be opened as shown in FIG. 4. In step 1006, cables 402 may be placed inside the open cable channel 412 as shown by the arrows in FIG. 4. In step 1008, markings 401 on cables 402 may be used to align cables 402 within open cable channel 412 as shown in FIG. 5. Next, in step 1010, cable channel 412 may be closed around the aligned cables 402 as shown in FIGS. 5 and 6A. Steps 1004 to 1010 may be performed while cable channel 412 is separate from, and not engaged with, system chassis 700.

Next, in step 1012, closed cable channel 412 may be installed within chassis base 702 within designated side opening 790 adjacent fan gantry 750 as shown by the arrow in FIG. 7A, e.g., by sliding the closed cable channel 412 vertically downward into side opening 790. Then, in step 1014, cables 402 may be routed inside chassis base 702 and plugged into motherboard 720 in the direction of the arrow shown in FIG. 7A. Finally, in step 1016, top cover 704 may be assembled to the chassis base 702 as shown in FIG. 7B. It will be understood that the cable channel 412 and cables 402 may be de-installed or removed from chassis base 702 by reversing the above steps, for example, by removing top cover 704, then unplugging cables 402 from motherboard 720 (and/or from backplane 760 or other PCB 761), then sliding the closed cable channel 412 vertically upward out of side opening 790, then opening cable channel 412, and then removing the cables 402 from the open cable channel 412.

It will also be understood that the steps of methodology 1000 are exemplary only, and that any other step order and/or combination of fewer, additional and/or alternative steps may be employed that is suitable for installing and de-installing a cable channel and system cables within a designated open space of an information handling system chassis to route the system cables into the interior of the system chassis in a sealed manner that prevents cooling airflow recirculation through or around the system cables and the installed cable channel.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed apparatus and methods may be utilized in various combinations and/or independently. Thus the invention is not limited to only those combinations shown herein, but rather may include other combinations.

What is claimed is:

1. An information handling system, comprising:
a chassis having a space defined between two fixed spaced-apart surfaces, each of the two fixed spaced-apart surfaces extending upward from a bottom of the chassis; and
an apparatus slidably received within the space defined between the two fixed spaced-apart surfaces to form a seal against airflow, the apparatus comprising:
a shell including a clamp and a body, the clamp and body being joined together into contact with each other in a closed position, and
a compressible material disposed on at least one of an inner surface of the clamp or an inner surface of the body;
where each of the clamp and body has a first end that contacts the bottom of the chassis, where the clamp has a second end that is disposed opposite the first end of the clamp and where the body has a second end that is disposed opposite the first end of the body; and where the information handling system further comprises a top cover positioned over the apparatus and chassis and in contact with the second end of each of the second end of the clamp and the second end of the body.

2. The information handling system of claim 1, where the clamp and body have an open position when apart from each other.

3. The information handling system of claim 2, where the clamp is coupled by a hinge to the body, the clamp and the body being in the open position when rotated about the hinge apart from each other, and the clamp and the body being in the closed position when rotated about the hinge into contact with each other; and where in the open position the apparatus receives one or more objects between the clamp and the body, and where in the closed position the clamp and body join together around the received objects and the compressible material forms a seal against airflow through the apparatus around the received objects.

4. The information handling system of claim 2, where the clamp is a separate component from the body, the clamp and the body being spaced apart and not contacting each other when in the open position, and the clamp and the body being joined together in contact with each other when in the closed position; and where in the open position the apparatus receives one or more objects between the clamp and the body, and where in the closed position the clamp and body join together around the received objects and the compressible material forms a seal against airflow through the apparatus around the received objects.

5. The information handling system of claim 4, where in the closed position the first end of the clamp and the first end of the body are held together without the presence of a hinge by a first latch tang received within a first latch receptacle, and the second end of the clamp and the second end of the body are held together by a second latch tang received within a second latch receptacle; and where in the open position the first end of the clamp is spaced apart from the first end of the body with the first latch tang not contacting or being received within the first latch receptacle, and the second end of the clamp is spaced apart from the second end of the body with the second latch tang not contacting or being received within the second latch receptacle.

6. The information handling system of claim 2, where the clamp and body join together in the closed position in the absence of any received objects with the compressible material forming a seal between the clamp and the body against airflow.

7. The information handling system of claim 2, where the clamp and body are one piece of injection molded plastic joined together by a living hinge.

8. The information handling system of claim 2, where the compressible material comprises only one of:
a first block of compressible material that is disposed on an inner surface of the body, and a second block of compressible material disposed on an inner surface of the clamp; or
a single block of compressible material that is either disposed on an inner surface of the body or on an inner surface of the clamp.

9. The information handling system of claim 2, where the compressible material comprises memory foam.

10. The information handling system of claim 2, where the apparatus has only a single block of compressible material that is either disposed only on an inner surface of the body or disposed only on an inner surface of the clamp.

11. The information handling system of claim 1, where the top cover is positioned over the apparatus and chassis to form a seal against airflow through the closed apparatus and the space defined between the two fixed spaced-apart surfaces of the information handling system.

12. The information handling system of claim 11, where the clamp and body join together to receive one or more objects positioned between the clamp and the body; and where the compressible material forms a seal against airflow through the apparatus around the received objects.

13. The information handling system of claim 12, where the objects are information handling system cables.

14. The information handling system of claim 13, where an outer surface of each of the information handling system cables has at least one marking defined thereon that is aligned with the position of the apparatus.

15. The information handling system of claim 1, where the two fixed spaced-apart surfaces are permanently fixed and spaced-apart surfaces of a chassis of an information handling system.

16. The information handling system of claim 1, where at least one of the two fixed spaced-apart surfaces is a surface of a fan gantry.

17. The information handling system of claim 1, where the chassis of the information handling system is a 1U chassis.

18. The information handling system of claim 1, where the apparatus is slidably received within the space defined between the two fixed spaced-apart surfaces of the chassis without the presence of any fasteners to retain the apparatus to the chassis.

19. The information handling system of claim 1, where the top cover retains the apparatus in place within the space defined between the two fixed spaced-apart surfaces.

20. A method of using the information handling system of claim 1, comprising:
moving the apparatus of claim 8 from an open position to the closed position, the clamp and the body being apart from each other in the open position; and
installing the closed apparatus into the space defined between the two fixed spaced-apart surfaces within the chassis of the information handling system of claim 1 by sliding the closed apparatus into the space to form the seal against airflow.

21. The method of claim 20, further comprising inserting one or more cables between the clamp and the body when the apparatus is in the open position; where the step of moving the apparatus from the open position to the closed position comprises joining the clamp and body together around the inserted cables with the compressible material forming a seal against airflow through the apparatus around the inserted cables; and where the step of installing the closed apparatus comprises sliding the closed apparatus with the inserted cables into the space and positioning the top cover over the apparatus and chassis in contact with the second end of each of the second end of the clamp and the second end of the body to form a seal against airflow through the closed apparatus and the space defined between the two fixed spaced-apart surfaces of the information handling system.

22. The method of claim 21, where an outer surface of each of the one or more cables has at least one pre-existing marking defined thereon; and where the step of inserting the one or more cables between the clamp and the body when the apparatus is in the open position comprises using the one or more markings to align the longitudinal position of each of the one or more cables relative to the apparatus prior to the step of joining the clamp and body together around the inserted cables.

23. The method of claim 21, where the chassis of the information handling system comprises a motherboard disposed within the chassis on a first side of the space defined between the two fixed spaced-apart surfaces, and at least one of a backplane or other printed circuit board (PCB) disposed on a second and opposite side of the space defined between the two fixed spaced-apart surfaces; and where the method further comprises joining the clamp and body together around the inserted cables prior to electrically coupling a first end of one or more of the inserted cables to the motherboard, and electrically coupling the first end of one or more of the inserted cables to the motherboard after sliding the closed apparatus with the inserted cables into the space.

24. The method of claim 20, where at least one of the fixed spaced-apart surfaces is a surface of a fan gantry that comprises one or more cooling fans.

25. The method of claim 20, where the chassis of the information handling system is a 1U chassis.

\* \* \* \* \*